United States Patent
Suzuki et al.

(10) Patent No.: US 12,050,401 B2
(45) Date of Patent: Jul. 30, 2024

(54) IMPRINTING DEVICE, IMPRINTING METHOD, AND METHOD FOR MANUFACTURING SEMICONDUCTOR DEVICE

(71) Applicant: Kioxia Corporation, Tokyo (JP)

(72) Inventors: Motoko Suzuki, Yokohama Kanagawa (JP); Kazuya Fukuhara, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 527 days.

(21) Appl. No.: 17/462,786

(22) Filed: Aug. 31, 2021

(65) Prior Publication Data

US 2022/0197135 A1      Jun. 23, 2022

(30) Foreign Application Priority Data

Dec. 18, 2020   (JP) ................. 2020-210183

(51) Int. Cl.
  *G03F 7/00*   (2006.01)
  *H01L 21/027*   (2006.01)
(52) U.S. Cl.
  CPC .......... *G03F 7/0002* (2013.01); *H01L 21/027* (2013.01)
(58) Field of Classification Search
  None
  See application file for complete search history.

(56) References Cited

U.S. PATENT DOCUMENTS

| 2012/0217675 A1 | 8/2012 | Usui |
| 2016/0223918 A1 | 8/2016 | Asano et al. |
| 2019/0358863 A1 | 11/2019 | Kimura |
| 2020/0379342 A1* | 12/2020 | Ghariehali ............ G03F 7/0002 |

FOREIGN PATENT DOCUMENTS

| JP | 2012-178470 | 9/2012 |
| JP | 2015-111657 | 6/2015 |
| JP | 2016-058735 | 4/2016 |
| JP | 2019-204907 A | 11/2019 |

* cited by examiner

*Primary Examiner* — Feifei Yeung Lopez
(74) *Attorney, Agent, or Firm* — Foley & Lardner LLP

(57) ABSTRACT

An imprinting device includes an aligner configured to adjust a relative position between an original plate and a substrate when the original plate including a pattern is moved into contact with the substrate including a transfer target material; a first irradiator configured to irradiate the transfer target material with first light based on an irradiation condition before adjusting the relative position; a second irradiator configured to cure the transfer target material by irradiating the transfer target material with second light after adjusting the relative position; an index acquirer configured to acquire an accuracy index indicating an adjustment accuracy of the adjusted relative position; a memory configured to store data including a plurality of the accuracy indexes acquired for a plurality of the substrates; and a controller configured to adjust the irradiation condition when subsequently using the first irradiator based on the data.

16 Claims, 8 Drawing Sheets

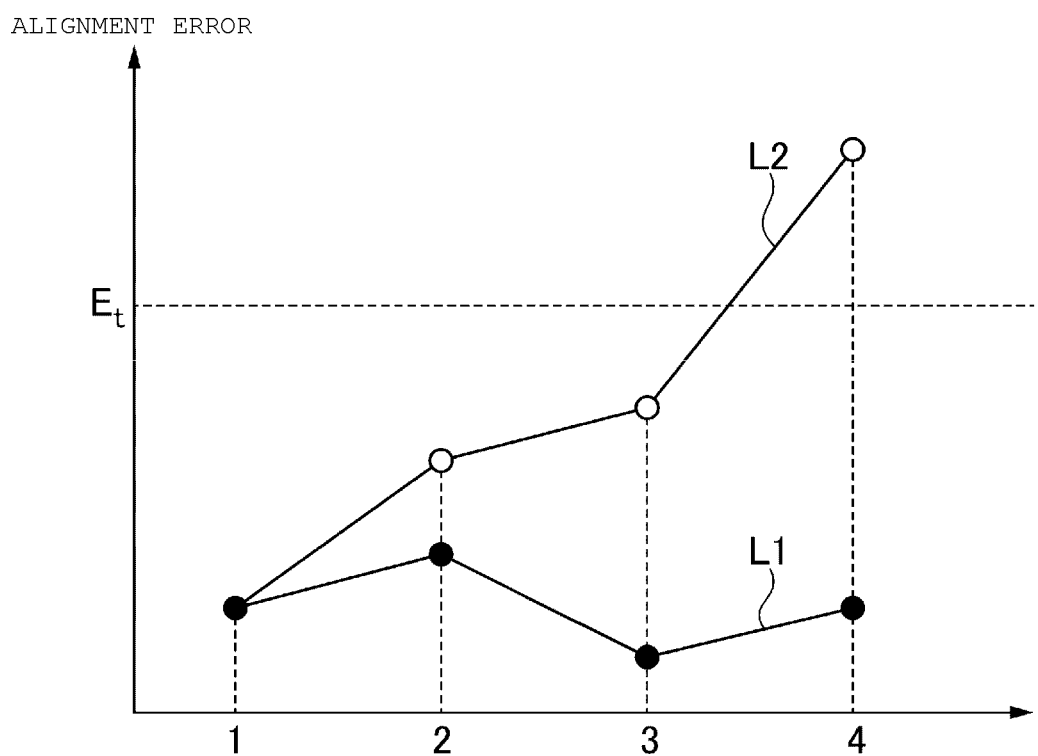

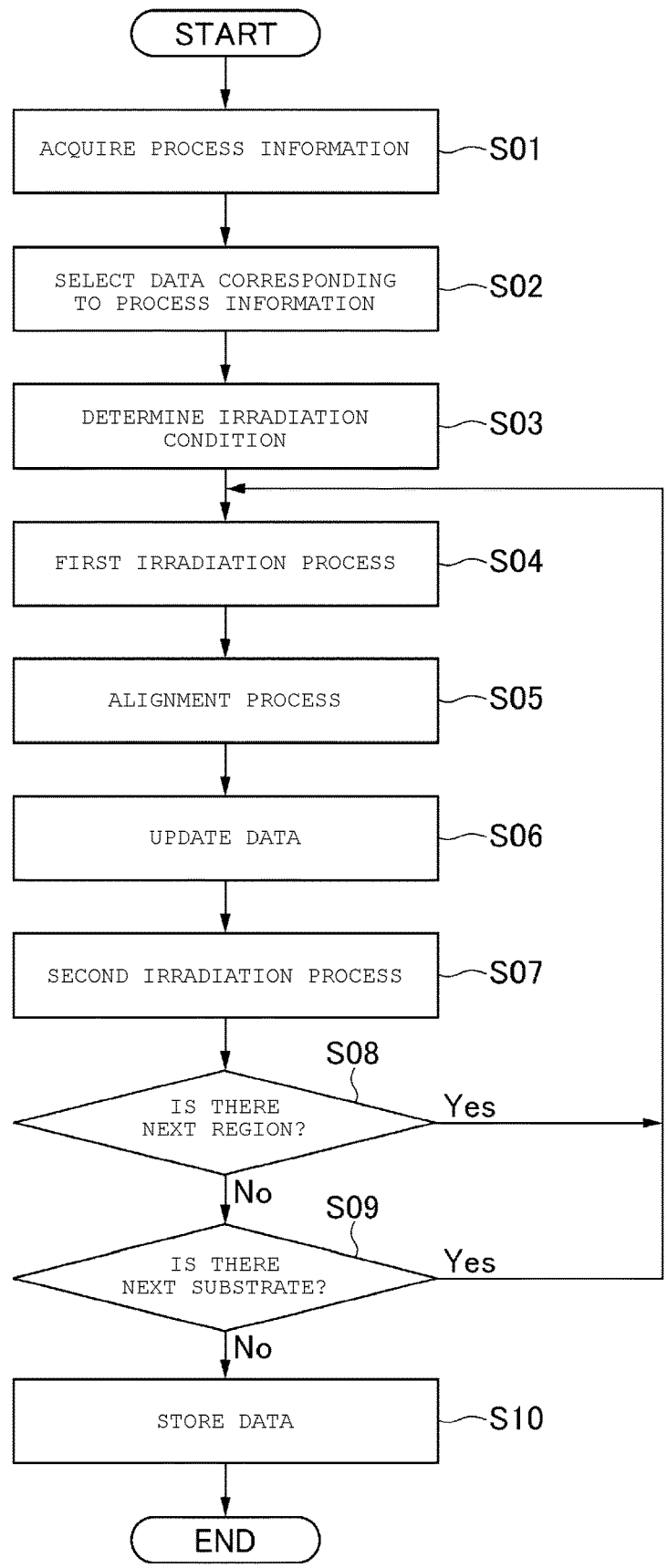

IMPRINTING DEVICE, IMPRINTING METHOD, AND METHOD FOR MANUFACTURING SEMICONDUCTOR DEVICE

CROSS-REFERENCE TO RELATED APPLICATION

This application is based upon and claims the benefit of priority from Japanese Patent Application No. 2020-210183, filed Dec. 18, 2020, the entire contents of which are incorporated herein by reference.

FIELD

Embodiments described herein relate generally to an imprinting device, an imprinting method, and a method for manufacturing a semiconductor device.

BACKGROUND

As a method for forming a fine pattern, a method called an imprinting method has been proposed. In an imprinting device using an imprinting method, an original plate on which a fine uneven pattern is formed is pressed against a substrate on which a transfer target material is formed, and then the transfer target material is cured. As a result, a film on which the uneven pattern is transferred can be formed on the substrate.

After pressing the original plate against the substrate, it is necessary to adjust the relative positional relationship between the original plate and the substrate in advance to reduce an alignment error between the two before curing the transfer target material.

In order to complete the above adjustment quickly, it is preferable to irradiate the transfer target material with light to increase the viscosity thereof so that vibration between the original plate and the substrate is less likely to occur.

DESCRIPTION OF THE DRAWINGS

FIG. 6 is a diagram showing an example of a time change of an alignment error when an uneven pattern is repeatedly transferred.

FIG. 7 is a flowchart showing a flow of a process executed by the control device.

DETAILED DESCRIPTION

Figure 1:
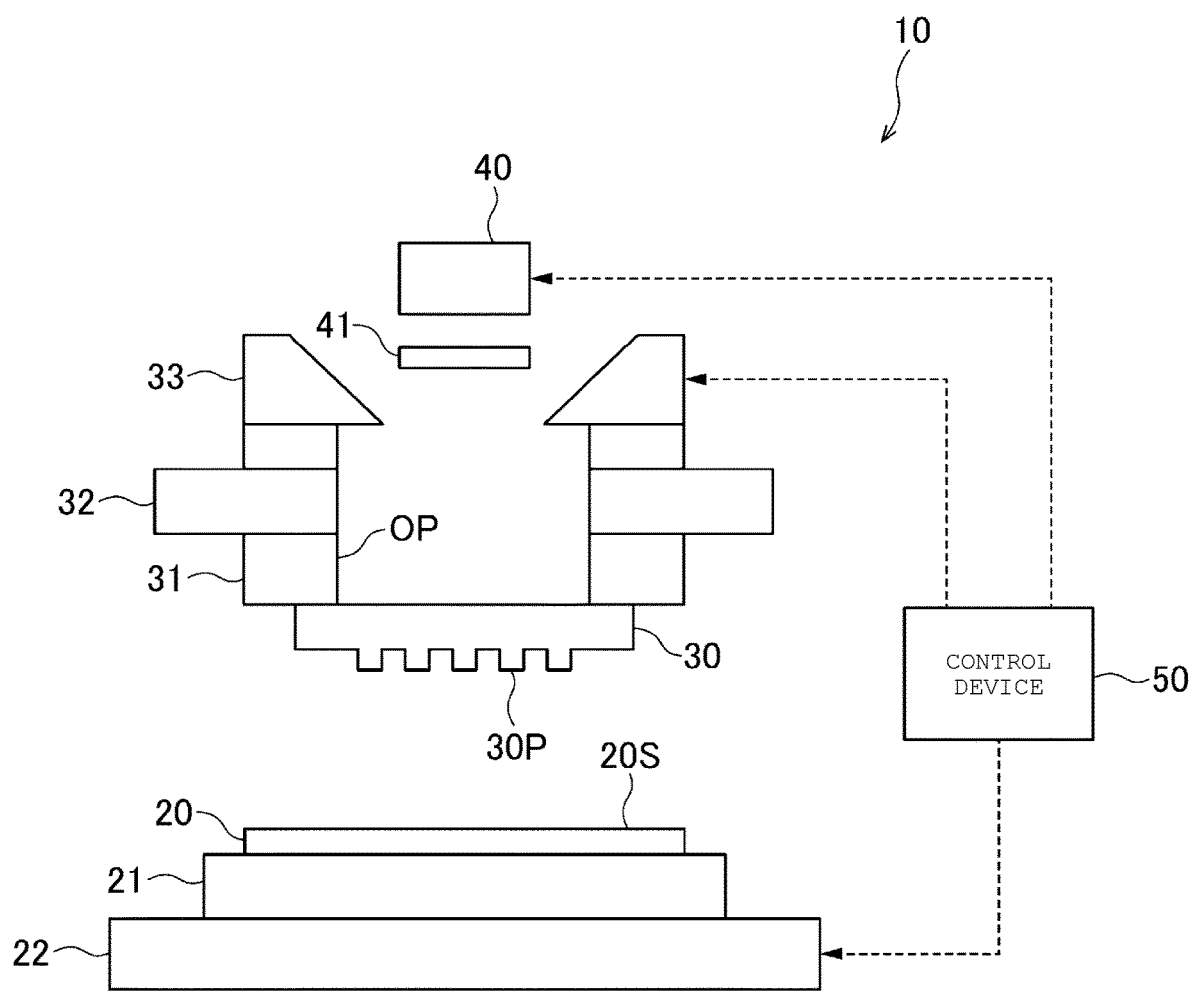
FIG. 1 is a diagram schematically showing a configuration of an imprinting device according to an embodiment.

An appropriate irradiation condition for increasing the viscosity of the transfer target material varies depending on the condition of the transfer target material and the substrate. Therefore, in an imprinting device that repeatedly transfers a pattern on a plurality of substrates, it is necessary to reset the irradiation condition every time a lot of substrates changes, for example.

Embodiments provide an imprinting device, an imprinting method, and a method for manufacturing a semiconductor device, which can easily and appropriately set an irradiation condition for increasing the viscosity of the transfer target material.

In general, according to one embodiment, an imprinting device includes
an aligner configured to adjust a relative position between an original plate and a substrate when the original plate including a pattern is moved into contact with the substrate including a transfer target material; a first irradiator configured to irradiate the transfer target material with first light based on an irradiation condition before the aligner adjusts the relative position between the original plate and the substrate; a second irradiator configured to cure the transfer target material by irradiating the transfer target material with second light after the aligner adjusts the relative position between the original plate and the substrate;
an index acquirer configured to acquire an accuracy index indicating an adjustment accuracy of the adjusted relative position; a memory configured to store data including a plurality of the accuracy indexes acquired for a plurality of the substrates; and a controller configured to adjust the irradiation condition when subsequently using the first irradiator based on the data.

Hereinafter, the present embodiment will be described with reference to the accompanying drawings. In order to facilitate understanding of the description, the same components are designated by the same reference numerals as much as possible in each drawing, and duplicate description is omitted.

The configuration of an imprinting device 10 according to the present embodiment will be described. The imprinting device 10 is a device used for manufacturing a semiconductor device, and is a device for transferring an uneven pattern on a transfer target material provided on a substrate 20. The semiconductor device to be manufactured is, for example, a NAND flash memory. As shown in FIG. 1, the imprinting device 10 includes a substrate chuck 21, a substrate stage 22, an original plate 30, an original plate chuck 31, a base 32, an alignment sensor 33, a light source 40, and a control device 50.

The substrate chuck 21 is a device that holds the substrate 20, for example, an electrostatic chuck. The substrate 20 on which a pattern is transferred is held by the substrate chuck 21 from below with a front surface 20S facing upward. The front surface 20S of the substrate 20 has a processing target film formed on the substrate 20, and a liquid transfer target material is pre-coated on the processing target film by a coating device (not shown) to a uniform thickness. The substrate 20 of the present embodiment is a semiconductor substrate such as a silicon wafer. The transfer target material, which is applied to the substrate 20, is cured by light from the light source 40, which will be described later, and functions as a resist when etching a processing target film, for example, in a later step.

A closed container (not shown) called a hoop is attached to the imprinting device 10. The hoop contains a plurality of substrates 20 that are previously subjected to a film formation process or the like in a previous step. The substrate 20 held by the substrate chuck 21 in FIG. 1 is taken out from the hoop and then conveyed by a conveyance mechanism (not shown).

The substrate stage 22 is a device that supports the substrate chuck 21. The substrate stage 22 can move the substrate chuck 21 and the substrate 20 held by the substrate chuck 21 along X and Y directions parallel to the front surface 20S and perpendicular to each other. Further, the substrate stage 22 can also move the substrate chuck 21 and the substrate held by the substrate chuck 21 along a Z direction perpendicular to the front surface 20S. In this way, the substrate stage 22 is configured with so-called an "XYZ stage". The substrate stage 22 may be configured with an "XYZθ stage" capable of further rotating the substrate 20 and the like around the Z axis. The operation of the substrate stage 22 is controlled by the control device 50 described later.

The original plate 30 is a template in which an uneven pattern 30P is formed on the front surface thereof. The uneven pattern 30P corresponds to the uneven pattern transferred on the transfer target material provided on the substrate 20. The entire original plate 30, including the part where the uneven pattern 30P is formed, is made of a material that is transparent to the wavelength of the light emitted from the light source 40.

The original plate chuck 31 is a device that holds the original plate 30, and is, for example, a mechanical clamp device. The original plate 30 is held by the original plate chuck 31 with the surface on which the uneven pattern 30P is formed facing downward, that is, the substrate 20 side. An opening OP for passing light from the light source 40 is formed in a part of the original plate chuck 31 and the base 32 directly above the uneven pattern 30P.

The base 32 is a frame that supports the original plate chuck 31. In the present embodiment, the original plate 30 and the original plate chuck 31 are fixed to the base 32, and the positions thereof cannot be changed. Instead of such an embodiment, a mechanism that changes the position of the original plate 30 or the like may be provided between the base 32 and the original plate chuck 31.

The alignment sensor 33 is a sensor for detecting the relative positional relationship between the original plate 30 and the substrate 20. In order to enable such detection, each of the original plate 30 and the substrate 20 is provided with an alignment mark (not shown) in advance. The alignment sensor 33 captures each alignment mark from the upper side through the opening OP and measures the degree of deviation between the two. The "degree of deviation" is, for example, the distance between the alignment mark provided on the original plate 30 and the alignment mark provided on the substrate 20. An uneven pattern is formed with respect to the transfer target material provided on the substrate 20 in a state where the relative positional relationship between the original plate 30 and the substrate 20 is adjusted in advance so that the distance is as close to 0 as possible. The above distance is also referred to as an "alignment error" below. The alignment error measured by the alignment sensor 33 is transmitted to the control device 50.

The light source 40 is a device that emits light (for example, ultraviolet rays) for curing the transfer target material. The light source 40 is, for example, a mercury lamp. The light source 40 can change the intensity of the emitted light. The wavelength of the emitted light may be variable. By changing the intensity, wavelength, and the like of the emitted light, the light source 40 does not completely cure the transfer target material, but can only increase the viscosity of the transfer target material. The intensity of the light emitted from the light source 40 and the like are adjusted by the control device 50.

An irradiation amount adjusting mechanism 41 may be disposed between the light source 40 and the substrate 20, that is, at a position in the middle of the path for the light to reach the substrate 20. The irradiation amount adjusting mechanism 41 adjusts the irradiation amount of light reaching the substrate 20 by a mechanical operation. The irradiation amount adjusting mechanism 41 is, for example, a shutter device, a mirror device, or the like. When the irradiation amount adjusting mechanism 41 is disposed, the control device 50 adjusts the irradiation amount of the light reaching the substrate 20 from the light source 40 by controlling the operation of the irradiation amount adjusting mechanism 41.

The control device 50 is a device that comprehensively controls the overall operation of the imprinting device 10. The control device 50 is configured with a computer system having a CPU, RAM, ROM, and the like. The control device 50 may be built in the imprinting device 10, or may be installed at a position away from the imprinting device 10.

Figure 2:
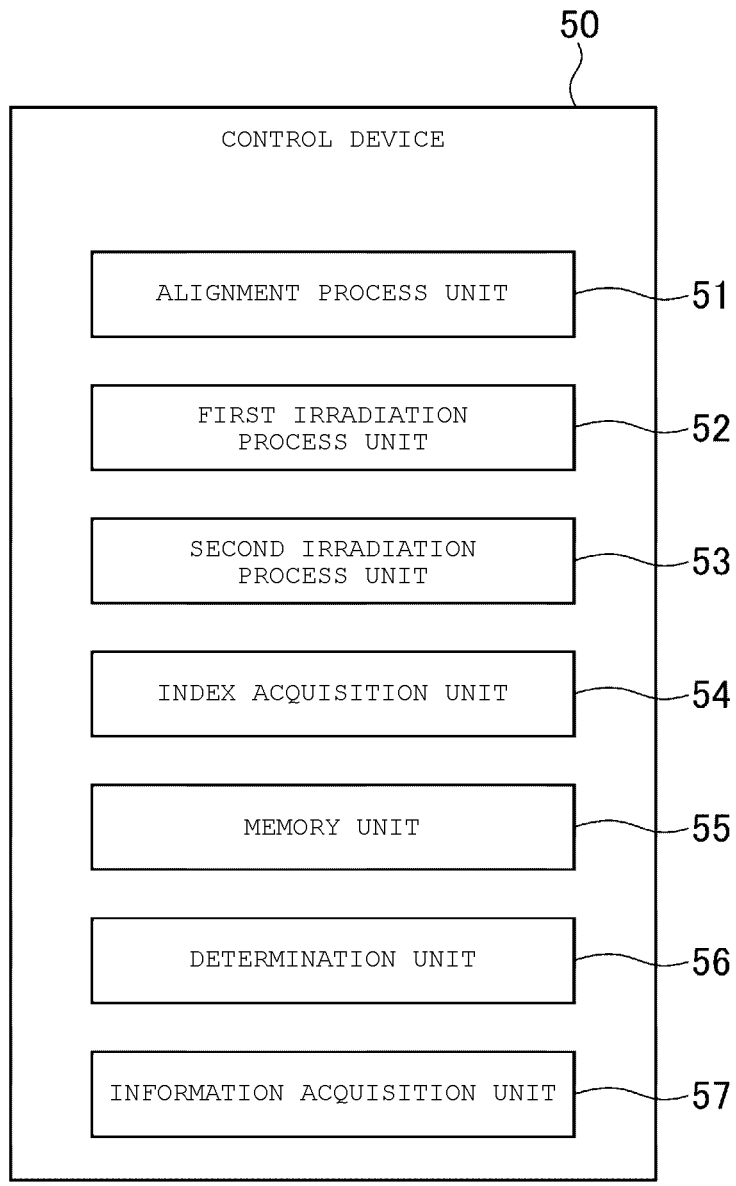
FIG. 2 is a diagram showing a configuration of a control device in the imprinting device.

As shown in FIG. 2, the control device 50 includes an alignment process unit (or aligner) 51, a first irradiation process unit (or first irradiator) 52, a second irradiation process unit (or second irradiator) 53, an index acquisition unit (or index acquirer) 54, a memory unit (or memory) 55, a determination unit (or controller) 56, and an information acquisition unit (or information acquirer) 57 as block elements representing the functions thereof.

The alignment process unit 51 is a unit that adjusts the relative positional relationship between the original plate 30 and the substrate 20 in a state where the original plate 30 is brought into contact with the substrate 20 on which the transfer target material is formed. The process will also be referred to as an "alignment process" below. It can be said that the alignment process is a process of moving the substrate stage 22 in a direction parallel to the front surface 20S and bringing the alignment error described above close to 0.

The first irradiation process unit 52 is a unit that increases the viscosity of the transfer target material by irradiating the transfer target material with light from the light source 40 based on a predetermined irradiation condition before the alignment process is complete. This process is also referred to as a "first irradiation process" below. In the first irradiation process, from the light source 40, the transfer target material is irradiated with light (first light) to a degree that the transfer target material is not completely cured, and therefore the viscosity of the transfer target material can be increased.

Figure 3A:
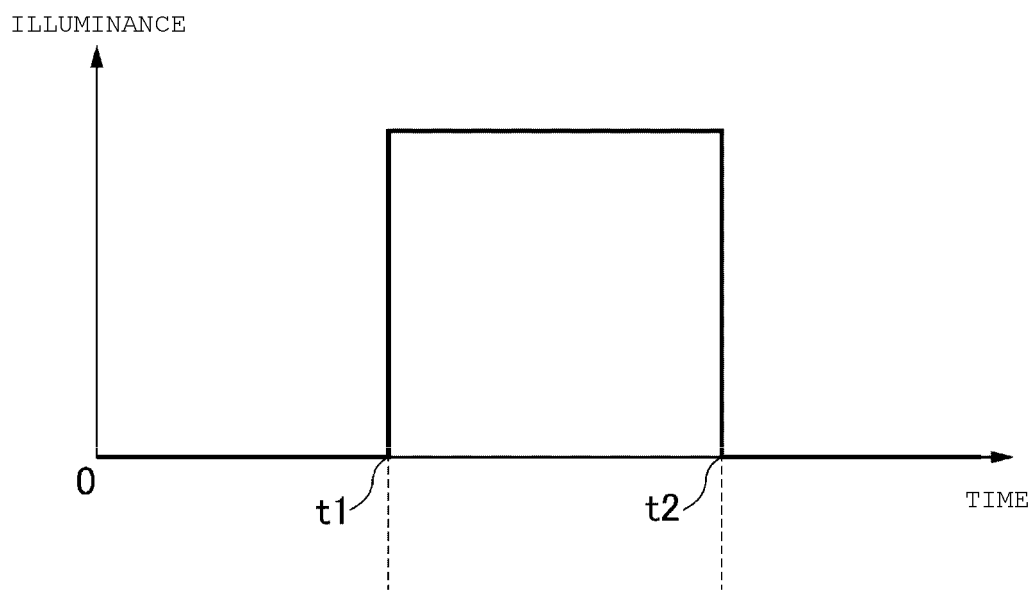
FIGS. 3A and 3B are diagrams showing a first irradiation process.

FIG. 3A is a graph showing the time change of the illuminance of the light reaching the transfer target material from the light source 40. The "illuminance" here is the energy of light that reaches per unit time with respect to the unit area of the transfer target material. In the example of the drawing, the first irradiation process is executed in the period from time t1 to time t2.

Figure 3B:
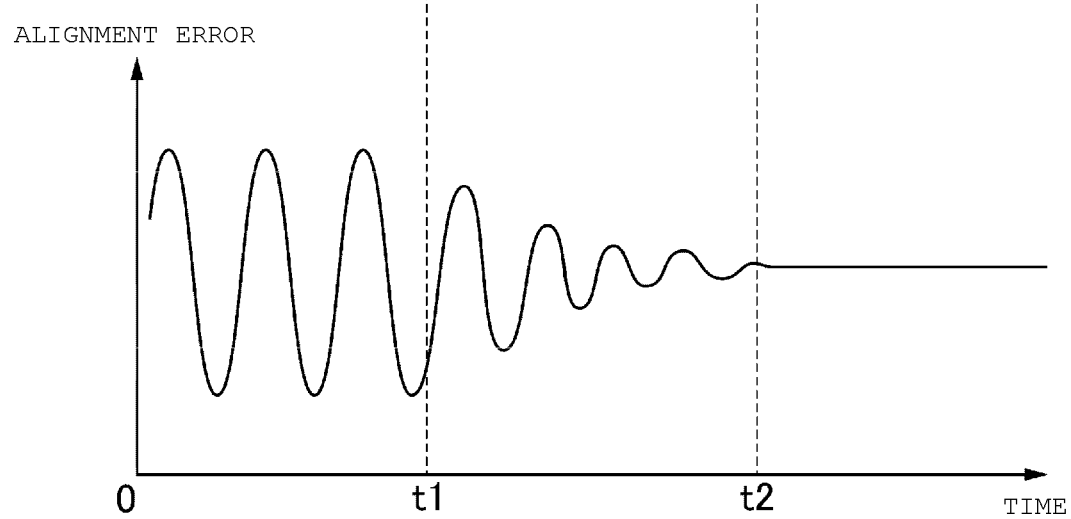

FIG. 3B is a graph showing the time change of the alignment error. Before the first irradiation process is started, that is, before time t1, the viscosity of the transfer target material is low, and therefore the relative positional relationship between the original plate 30 and the substrate 20 is likely to fluctuate. Therefore, the alignment error fluctuates with a relatively large amplitude.

When the first irradiation process is started at time t1, the amplitude of the alignment error gradually decreases as the viscosity of the transfer target material gradually increases. In the period after time t2 when the first irradiation process ends, the amplitude of the alignment error is sufficiently small. However, at this time, since the transfer target material is not completely cured, it is possible to adjust the relative positional relationship between the original plate 30 and the substrate 20 (that is, perform the alignment process). The alignment process unit 51 can bring the alignment error close to 0 in a short time by starting the alignment process at a timing after time t2 when the viscosity of the transfer target material becomes high, for example.

The first irradiation process may be executed before the start of the alignment process as described above, or may be executed in parallel with the alignment process. That is, the alignment process may be started before the first irradiation process is completed.

The "irradiation condition" of the first irradiation process specifies, for example, the irradiation amount of light reaching the transfer target material from the light source 40, that is, the energy of light reaching per unit area of the transfer target material. If the irradiation condition is not appropriate and the viscosity of the transfer target material remains low, fluctuations in the relative positional relationship between the original plate 30 and the substrate 20 cannot be sufficiently reduced. On the contrary, if the viscosity of the transfer target material becomes too high, it is difficult to adjust the positional relationship. The irradiation condition is predetermined by the determination unit 56 described later so that the viscosity of the transfer target material becomes an appropriate height.

The second irradiation process unit 53 is a unit that irradiates the transfer target material with light (second light) from the light source 40 to cure the transfer target material after the alignment process is completed. This process is also referred to as a "second irradiation process" below. When the second irradiation process is completed, the transfer target material is cured so to function as a resist on which an uneven pattern is formed.

In the present embodiment, the common light source 40 is used as a light source in the first irradiation process and a light source in the second irradiation process. Instead of such an embodiment, the light source used in the first irradiation process and the light source used in the second irradiation process may be different from each other.

The index acquisition unit 54 is a unit that obtains an index that indicates the adjustment accuracy of the relative positional relationship between the original plate 30 and the substrate 20 when the alignment process is executed. It can be said that "an index indicating the adjustment accuracy" is an index indicating how much the accuracy of the alignment process improves by the first irradiation process, or in other words, an index indicating the effectiveness of the first irradiation process. This index will also be referred to as an "accuracy index" below.

For example, the accuracy index may correspond to a time duration estimated from the time when the alignment process is started until the amplitude of the alignment error falls below a predetermined threshold value. In this case, the index acquisition unit 54 acquires the accuracy index based on the signal transmitted from the alignment sensor 33 when the alignment process is being executed.

As the accuracy index, for example, the magnitude of the force required to change the position of the substrate chuck 21 when the alignment process is executed may be used. In this case, the index acquisition unit 54 acquires the accuracy index based on the signal transmitted from the substrate stage 22 (for example, the signal indicating the output current value of a motor).

In this way, the accuracy index acquired by the index acquisition unit 54 may include any of the time required for the convergence of the fluctuation of the relative positional relationship between the original plate 30 and the substrate 20 or the magnitude of the force required for adjusting the positional relationship. In addition, both of the above may be included in the accuracy index.

The memory unit 55 is a nonvolatile storage device provided in the control device 50, and is, for example, an HDD or an SSD. The memory unit 55 stores data including a plurality of accuracy indexes acquired when the alignment process is executed for the plurality of substrates 20 to be processed by the imprinting device 10.

For example, the memory unit 55 stores the accuracy index acquired each time the alignment process is executed for each of the plurality of substrates 20 housed in the same hoop. The plurality of substrates 20 housed in the same hoop may be referred to hereinafter as "the substrate 20 of the same lot". That is, in the following description, the word "lot" is used to represent an aggregate of the plurality of substrates 20 housed in the same hoop. The definition of "lot" may be different. In any case, it is assumed that the substrate 20 in the same lot is preliminarily formed with the same specifications and the imprinting device 10 forms an uneven pattern with the same specifications.

The above-mentioned "data" stored in the memory unit 55 includes not only the accuracy index but also the irradiation amount of light when the first irradiation process is executed. That is, the memory unit 55 stores as the above-mentioned "data" a combination of the accuracy index when the alignment process is executed and the irradiation amount in the first irradiation process executed prior to the alignment process. The data is individually acquired and stored for each lot of the substrates 20.

The determination unit 56 is a unit that determines the irradiation condition when the first irradiation process is executed next, based on the above data stored in the memory unit 55. "When the first irradiation process is executed next" is, for example, when the first irradiation process is executed for a next lot after the data is acquired and stored for a current lot.

The information acquisition unit 57 is a unit that acquires information indicating the contents of the processes executed so far for the substrate 20 for which the alignment process is to be executed from now on. The information acquired by the information acquisition unit 57 is also referred to as "process information" below. The use of the process information will be described later.

The outline of the method in which the determination unit 56 determines the irradiation condition will be described with reference to FIG. 4. The arrow shown on the left side of the drawing represents the flow of time when the plurality of substrates 20 are processed by the imprinting device 10. The dotted line shown in the drawing represents a present time when the process of an N-th lot is completed. N is any natural number.

Figure 4:
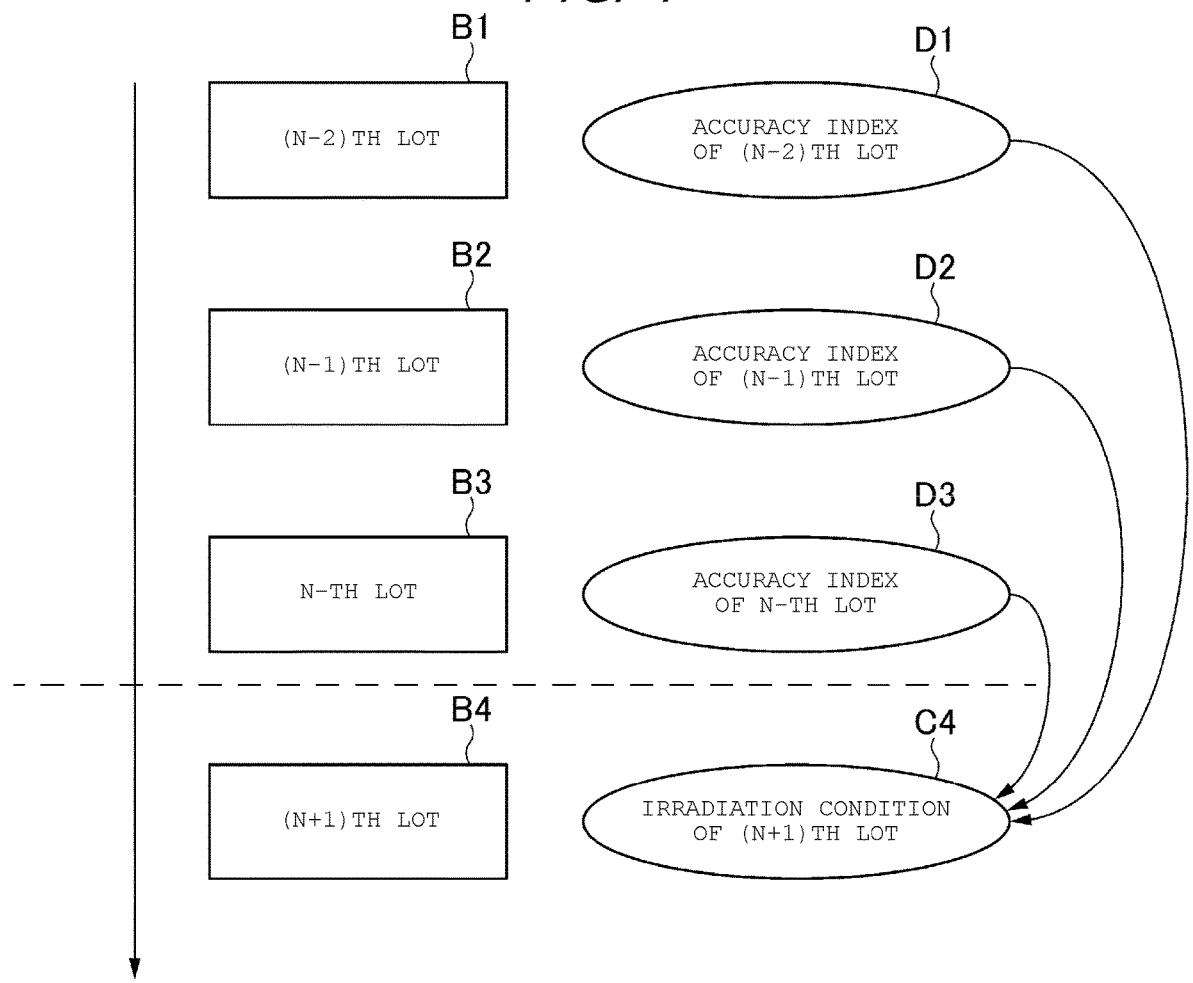
FIG. 4 is a diagram showing an outline of a method for determining an irradiation condition.

In the example of FIG. 4, N lots from a first lot to the N-th lot are processed up to the present time indicated by the dotted line. That is, an uneven pattern is formed on each of the substrates 20 housed in the N hoops. In FIG. 4, a block B3 indicates that the latest N-th lot is processed, a block B2 indicates that the immediately preceding (N−1)th lot is processed, a block B1 indicates that the immediately preceding the (N−2) th lot is processed, and a block B4 indicates the (N+1)th lot to be processed after the N-th lot.

When the (N−2)th lot is processed, data D1 including the accuracy index acquired at that time is stored. Similarly, when the (N−1)th lot is processed, data D2 including the accuracy index acquired at that time is stored, and when the N-th lot is processed, data D3 including the accuracy index acquired at that time is stored. As described above, each data D1 and the like stored in the memory unit 55 also includes the irradiation amount of light when the first irradiation process is executed.

The determination unit 56 determines an irradiation condition C4 for the (N+1)th lot based on the N pieces of data D1 and the like acquired so far, prior to the start of the process of the (N+1)th lot. Specifically, a correction amount is calculated by using the following Equation 1, and the irradiation amount obtained by adding the correction amount to a predetermined basic amount is determined as the irradiation condition C4 for the (N+1)th lot.

$$\text{Correction Amount} = \sum_{n=M}^{N} \{P_1(n) \times P_2(n) \times \alpha(n)\} \quad (1)$$

"$P_1(n)$" in Equation (1) represents an accuracy index acquired when an n-th lot is processed. "n" is a natural number corresponding to the above "N". In the present embodiment, as the accuracy index, the time required from the time when the alignment process is started until the amplitude of the alignment error falls below the predetermined threshold value is used.

Figure 5:
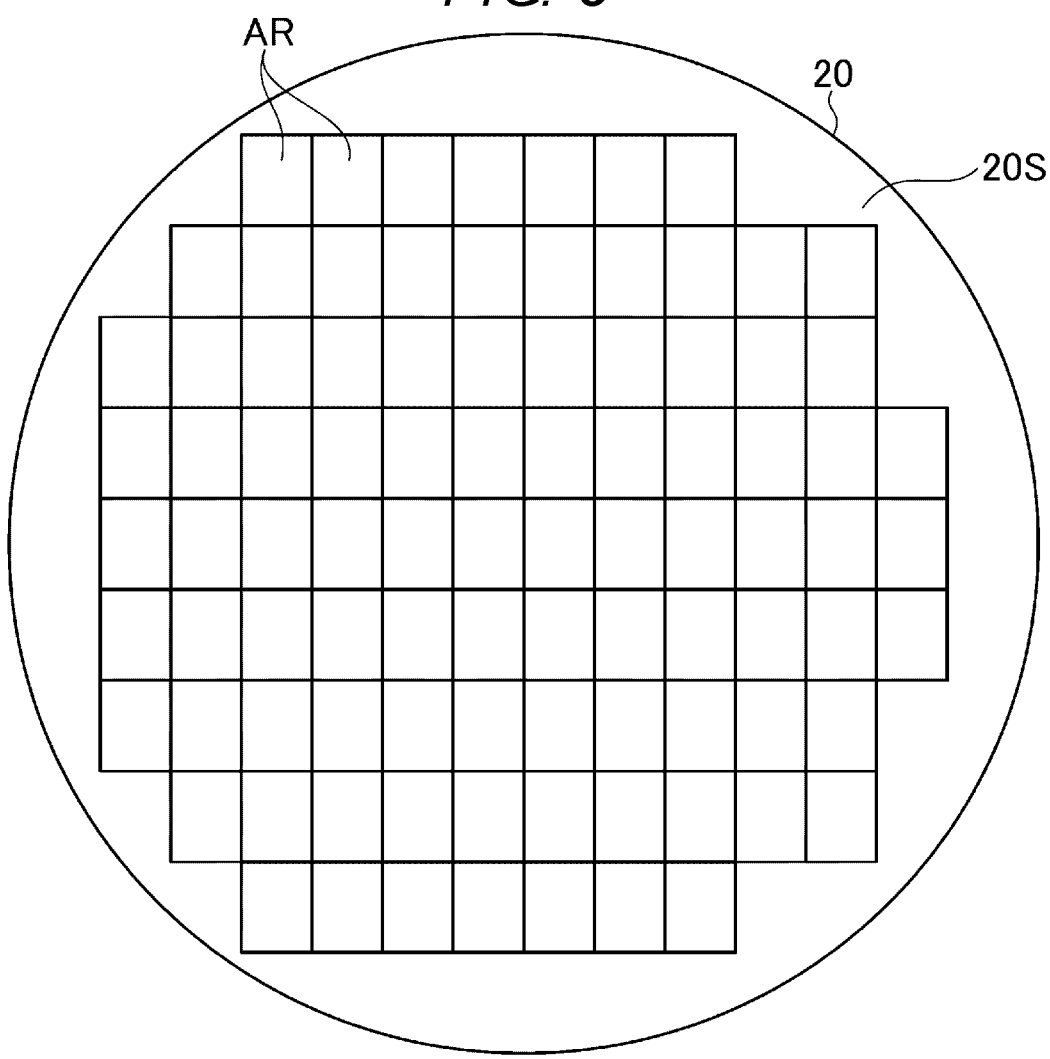
FIG. 5 is a diagram showing a plurality of regions on which an uneven pattern is transferred on a substrate.

As shown in FIG. 5, the front surface 20S of the substrate 20 is divided into a plurality of regions AR, and a process of transferring an uneven pattern of the original plate 30 is sequentially executed for each region AR. That is, the first irradiation process and the alignment process are executed in order for each region AR. The region AR is also referred to as, for example, a "shot region". Therefore, every time one substrate 20 is processed, the accuracy index is acquired by the number of regions AR. Further, since the plurality of substrates 20 are processed in the same lot, the accuracy index acquired when the n-th lot is processed is acquired by multiplying the number of regions AR by the number of substrates 20.

$P_1(n)$ representing the accuracy index acquired when the n-th lot is processed may be, for example, an average value of all accuracy indexes acquired by the number of regions AR multiplied by the number of substrates 20. In addition, for each substrate 20, an accuracy index is acquired only for a specific one region AR, and the average of the accuracy indexes of all substrates 20 in a lot may be used as $P_1(n)$. Further, an accuracy index acquired for the specific one region AR of a specific one substrate 20 in the n-th lot may be used as $P_1(n)$ as it is. In any case, one numerical value typically representing the accuracy index acquired when the n-th lot is processed is used as $P_1(n)$ in Equation (1).

"$P_2(n)$" in Equation (1) is the amount of light emitted to the substrate 20 in the first irradiation process executed in advance when the n-th lot is processed. The irradiation amount is the energy of light that reaches per unit area of the transfer target material, and is a value obtained by integrating the light irradiation time with the illuminance shown on the vertical axis of FIG. 3A. $P_2(n)$ is expressed as a numerical value representing a fluctuation from the irradiation amount when the standard irradiation amount is 1. For example, when the irradiation amount in the n-th lot is 1.2 times the standard irradiation amount, the value of $P_2(n)$ is set to 1.2.

Similar to $P_1(n)$ described above, one numerical value typically representing the irradiation amount acquired when the n-th lot is processed is also used as $P_2(n)$. $P_2(n)$ may be, for example, a numerical value corresponding to the average value of all the irradiation amounts obtained by multiplying the number of regions AR by the number of substrates 20 (1.2 in the above). In addition, for each substrate 20, a numerical value corresponding to an irradiation amount only for a specific one region AR is acquired, and the average of the numerical values of all substrates 20 in a lot may be used as $P_2(n)$. Further, a numerical value corresponding to the irradiation amount acquired for a specific one region AR of a specific substrate 20 in the n-th lot may be used as $P_2(n)$ as it is.

"$\alpha(n)$" in Equation (1) is a weighting coefficient for calculating the weighted average for the value of $P_1(n) \times P_2(n)$. For example, $\alpha(n)$ is set to a larger value as the latest lot is processed.

As shown in Equation (1), the correction amount is calculated by integrating the value of $P_1(n) \times P_2(n) \times \alpha(n)$ for n from M to N. "M" is any natural number set in the range of 1 or more and N or less. It can be said that the correction amount calculated by Equation (1) is a weighted average of a plurality of $P_1(n)$ indicating the accuracy index. In this way, the determination unit 56 determines an irradiation condition when the first irradiation process is executed next, based on the weighted average of the plurality of accuracy indexes in the data. A predetermined coefficient for adjusting the value of the calculated correction amount may be multiplied to the whole of Equation (1).

The correction amount calculated by using Equation (1) can be calculated based on the relationship between the irradiation amount of the first irradiation process and the effectiveness thereof in a plurality of past lots. The determination unit 56 determines an irradiation amount obtained by adding the correction amount to a predetermined basic amount as the irradiation condition C4 for the (N+1)th lot. In the next lot, the (N+1)th lot, the irradiation amount is appropriately set based on information in the plurality of past lots.

As a method of appropriately setting an irradiation amount, it is conceivable to carry out a condition setting test or the like every time a lot is switched. However, in such a method, it takes too much time to set the irradiation amount, which increases the manufacturing cost. On the other hand, in the present embodiment, by using the Equation (1), the irradiation amount can be easily and appropriately determined in a short time even when the condition of the irradiation amount is not set.

The above-mentioned "basic amount" to which the correction amount is added may be a common value for each region AR of the substrate 20, or may be a different value for each region AR. Further, the basic amount may be a common value for each substrate 20 in the same lot, but may be different for each substrate 20. For example, the basic amount may be different between the first substrate 20 and the last substrate 20 in the lot. In any case, the irradiation condition C4 when the first irradiation process is executed for each region AR is determined by the determination unit 56 based on the data of the past lots stored in the memory unit 55.

FIG. 6 shows an example of a change in the alignment error when an uneven pattern is repeatedly transferred on the substrate 20. The numerical value shown on the horizontal axis of the drawing is a lot number. In the lot with a lot number 1, the first irradiation process and the like are executed after setting an optimum irradiation condition by setting the condition in advance. Therefore, the alignment error in the lot is kept relatively small.

The line L2 shows an example of a change in the alignment error when an uneven pattern is repeatedly transferred while the irradiation condition is fixed in the lots with a lot number 2 or later. As shown in the line L2, even if the lots are of the same type, if the irradiation condition is not changed, each time a lot is repeatedly processed, the alignment error becomes large, and finally, exceeds an allowable upper limit $E_t$. This is because the effectiveness of the first irradiation process (that is, the accuracy index described above) changes due to various factors.

Factors that change the effectiveness of the first irradiation process include, for example, that the thickness and composition of the transfer target material formed on the substrate 20 are not always the same, and that the thickness and composition of the film previously formed on the substrate 20 in the previous step are not always the same. In addition, the thickness of the alignment mark provided on the original plate 30 changes with the replacement of the original plate 30 is one of the factors that change the effectiveness of the first irradiation process. The effectiveness of the first irradiation process is affected by the state of the film formed in advance in the previous step because the intensity of light reflected by the film and passing through the transfer target material again changes.

The line L1 of FIG. 6 shows an example of a change in the alignment error when the irradiation condition is set each time in the lots with a lot number 2 or later as in the present embodiment. In the present embodiment, based on the past lot data stored in the memory unit 55, the determination unit 56 sets a suitable irradiation condition each time. Therefore, as in the example shown by the line L1, even if a lot is repeatedly processed, the alignment error can be prevented within the upper limit $E_t$.

The flow of the imprinting method including a specific process executed by the control device 50 in order to implement the setting of the irradiation condition as described above will be described with reference to FIGS. 7 and 8. The series of process shown in FIG. 7 is repeatedly executed by the control device 50 for each lot including a plurality of substrates 20 in forming an uneven pattern on each substrate 20. FIGS. 8A to 8E schematically show the state of the substrate 20 and the like in each step of the imprinting method. In the drawing, the transfer target material is designated by reference numeral "60". The material to which reference numeral "70" is attached is the processing target film formed on the substrate 20. In the following, each of materials will also be referred to as "transfer target material 60" and "processing target film 70".

In S1, which is a first step of the process shown in FIG. 7, the process of acquiring the process information is executed by the information acquisition unit 57. As described above, the process information is information indicating the contents of the processes executed so far for the substrate 20 for which the alignment process is to be executed from now on. The process information includes, for example, information indicating the type and thickness of the film formed on the substrate 20 of the current lot in the previous steps, and information such as the shape of etching performed on the film. The process information can be obtained from, for example, a server that manages the manufacturing step of a semiconductor device. Instead of such an aspect, the process information may be acquired based on the information manually input by an operator.

By the way, in the imprinting device 10, the substrate 20 having the same specifications is not always processed, and the substrates 20 having various specifications may be processed. Therefore, a plurality of pieces of data stored in the memory unit 55, that is, the data including the accuracy index, are not limited to one type, but a plurality of types of data are stored corresponding to the specifications of the various substrates 20 processed so far.

In S02 following S01, a plurality of pieces of data corresponding to the process information acquired in S01 are selected from the plurality of pieces data stored in the memory unit 55. The "data corresponding to the process information" is data acquired when a substrate having the same specifications as the substrate 20 to be processed is processed in the past. In S03 following S02, a process of determining the irradiation condition is executed by using only the data selected as described above. That is, the process of determining the irradiation condition is executed while using only the data selected in S02 as the data shown in D1 to D3 of FIG. 4. As described above, the process is executed by the determination unit 56 by using Equation (1).

In this way, the determination unit 56 determines the irradiation condition based on the data corresponding to the process information among the plurality of pieces of data stored in the memory unit 55. This prevents an inappropriate irradiation condition from being set based on the data acquired for the substrates 20 having different specifications.

Equation (1) used to determine the irradiation condition may be changed as appropriate. For example, when the influence of the fluctuation of the irradiation amount in each lot is negligible, all the values of $P_2(n)$ in Equation (1) may be set to 1.

Further, the irradiation condition determined by the determination unit 56 may be an irradiation amount as in the present embodiment, or may be a parameter of a type different from the irradiation amount. For example, one or more parameters of the output intensity of the light source 40 for irradiating the transfer target material 60 with light, the time during which the transfer target material 60 is irradiated with light, the wavelength of the light emitted to the transfer target material 60, the illuminance of light reaching the transfer target material 60, and the state of the irradiation amount adjusting mechanism 41 (for example, a parameter indicating the posture of a mirror device, and the like) may be determined as the irradiation condition. In any case, the irradiation condition can be determined by using Equation (1) or a similar Equation.

In the manufacturing step of the semiconductor device, the process executed in S03 corresponds to a step of determining the irradiation condition when the first irradiation process is executed next based on the data stored in the memory unit 55.

Figure 8A:
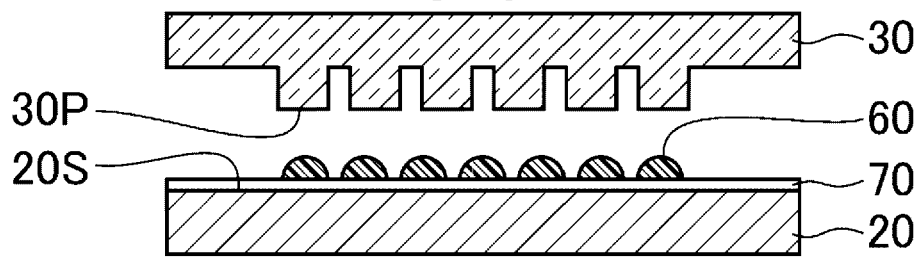
FIGS. 8A to 8E are diagrams schematically showing a state of the substrate in each step of an imprinting method.
Figure 8B:
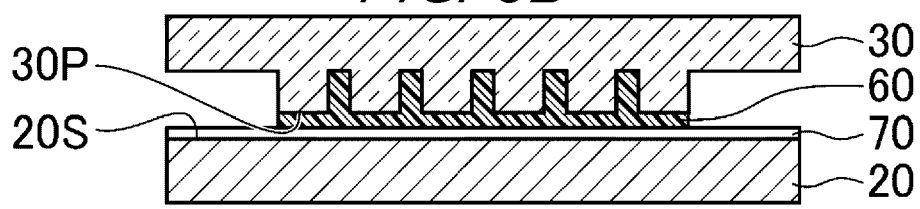

In S04 following S03, based on the irradiation condition set in S03, the first irradiation process is executed by the first irradiation process unit 52. Before the transition to S04, the transfer target material 60 is formed on the processing target film 70, as shown in FIG. 8A. The transfer target material 60 may be formed, for example, by dropping the transfer target material 60 on a plurality of locations of the processing target film 70, and the transfer target material 60 may be formed on the entire processing target film 70 by spin coating or the like. Thereafter, as shown in FIG. 8B, a process of bringing the uneven pattern 30P of the original plate 30 into contact with the transfer target material 60 provided on the substrate 20 by raising the substrate stage 22 (not shown) is executed in advance. In the first irradiation process of S04, the light from the light source 40 reaches the transfer target material 60 in the state shown in FIG. 8B.

In the manufacturing step of the semiconductor device, before the alignment process is completed, the process executed in S04 corresponds to a step of executing the first irradiation process, which is a process of irradiating the transfer target material 60 with light to increase the viscosity of the transfer target material 60, based on the predetermined irradiation condition.

In S05 following S04, the alignment process is executed by the alignment process unit 51. The alignment process unit 51, in the state shown in FIG. 8B, executes the alignment process by operating the substrate stage 22, for example. As described above, the first irradiation process of S04 may be executed in parallel with the alignment process of S05.

In the alignment process, the operation of the substrate stage 22 is controlled so that the alignment mark provided on the original plate 30 and the alignment mark provided on the substrate 20 overlap each other. The alignment mark of the substrate 20 is formed in advance in each region AR shown in FIG. 5.

In the manufacturing step of the semiconductor device, the process executed in S0S corresponds to a step of executing the alignment process, which is a process of adjusting the relative positional relationship between the original plate 30 and the substrate 20 in a state where the original plate 30 on which the uneven pattern 30P is formed is brought into contact with the substrate 20 on which the transfer target material 60 is formed.

During execution of the alignment process, the accuracy index is acquired by the index acquisition unit 54 based on, for example, a signal from the alignment sensor 33. The accuracy index is stored in the memory unit 55. In S06 following S05, the data including the accuracy index for the lot is updated based on a plurality of accuracy indexes acquired so far in the current lot. Such data update may be performed every time in S05, or may be performed only once when the process of the current lot is ended.

In the manufacturing step of the semiconductor device, the process executed in S05 and S06 corresponds to a step of acquiring an accuracy index, which is an index indicating the adjustment accuracy of the relative positional relationship between the original plate 30 and the substrate 20 when executing the alignment process. This accuracy index can be obtained when a plurality of substrates 20 are prepared and the alignment process is executed on each of the plurality of substrates 20.

Figure 8C:
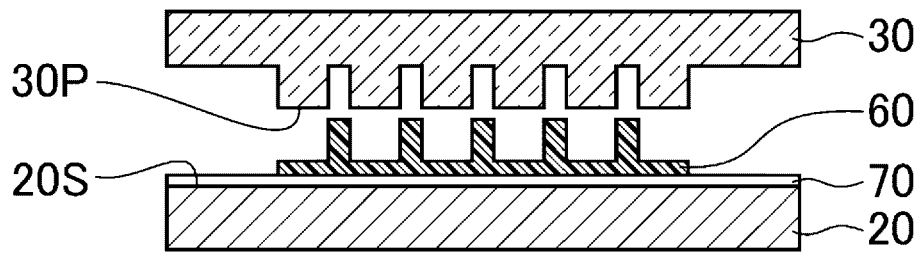

In S07 following S06, the second irradiation process is executed by the second irradiation process unit 53. As a result, the transfer target material 60 provided on the substrate 20 is completely cured with the uneven pattern formed. At this time, since the alignment error is brought close to 0 in advance by the alignment process, the uneven pattern of the transfer target material 60 is formed at a substantially correct position. In the second irradiation process of S07, the light from the light source 40 reaches the transfer target material 60 in the state shown in FIG. 8B. When the second irradiation process is completed, the process of releasing the original plate 30 from the transfer target material 60 is executed. Specifically, as shown in FIG. 8C, the substrate stage 22 (not shown) is pulled downward. As a result, the substrate 20 and the original plate 30 are separated from each other.

In the manufacturing step of the semiconductor device, the process executed in S07 corresponds to a step of executing the second irradiation process, which is a process of irradiating the transfer target material 60 with light to cure the transfer target material 60 after the alignment process is completed.

In S08 following S07, it is determined whether or not there is a region AR on which an uneven pattern is to be formed next on the substrate 20 currently being processed. When there is a region AR in which an uneven pattern is not formed, the region AR is moved to directly under the uneven pattern 30P, and then the process after S04 is executed again. When an uneven pattern is formed in all the regions AR of the current substrate 20, the process transitions to S09.

In S09, it is determined whether or not there is a next substrate 20 on which an uneven pattern is to be formed in the current lot. When there is a substrate 20 on which an uneven pattern is not to be formed in the lot, the substrate 20 is placed on the substrate chuck 21 and the process after S04 are executed again. When an uneven pattern is formed on all the substrates 20 of the current lot, the process transitions to S10.

In S10, the value of the accuracy index updated every time S06 is executed is stored in the memory unit 55 as the accuracy index of the current lot. At this time, the irradiation amount in the current lot is also stored in the memory unit 55. These pieces of information stored in S10 will be used as "data" for the current lot to determine the irradiation amount in the next and subsequent lots.

In the manufacturing step of the semiconductor device, the process executed in S10 corresponds to a step of storing data including an accuracy index acquired when the alignment process is executed for a plurality of substrates 20.

Figure 8D:
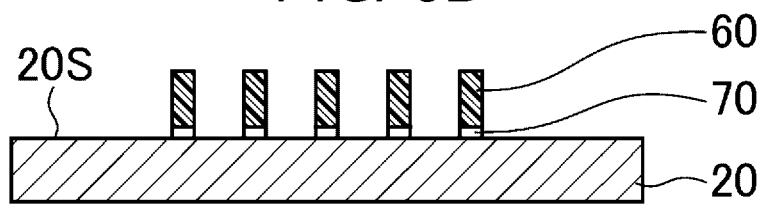
Figure 8E:
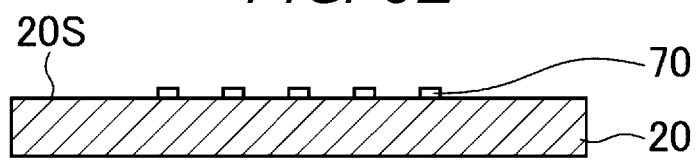

The substrate 20 having the transfer target material 60 on which an uneven pattern is formed is moved to another etching device or the like in a later step, and the etching step of the processing target film 70 using the transfer target material 60 as a mask is executed. As a result, the processing target film 70 is processed to form an uneven pattern, and a semiconductor device is manufactured. FIG. 8D schematically shows the state immediately after the etching step of the processing target film 70 using the transfer target material 60 as a mask. FIG. 8E schematically shows a state in which the transfer target material 60 is removed by asking from the state of FIG. 8D. In this way, a predetermined pattern corresponding to the uneven pattern 30P of the original plate 30 is formed on the processing target film 70.

The method as described above, that is, the imprinting method for forming an uneven pattern on the transfer target material 60 provided on the substrate 20, can be adopted not only in the manufacturing step of a semiconductor device as in the present embodiment but also in the manufacturing step of other products.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An imprinting device, comprising:
   an aligner configured to adjust a relative position between an original plate and a substrate when the original plate including a pattern is moved into contact with the substrate including a transfer target material;
   a first irradiator configured to irradiate the transfer target material with first light based on an irradiation condition before the aligner adjusts the relative position between the original plate and the substrate;
   a second irradiator configured to cure the transfer target material by irradiating the transfer target material with second light after the aligner adjusts the relative position between the original plate and the substrate;
an index acquirer configured to acquire an accuracy index indicating an adjustment accuracy of the adjusted relative position;
a memory configured to store data including a plurality of the accuracy indexes acquired for a plurality of the substrates; and
a controller configured to adjust the irradiation condition when subsequently using the first irradiator based on the data.

2. The imprinting device according to claim 1, further comprising:
an information acquirer configured to acquire process information indicating contents of processes that have been executed for the substrate before the aligner adjusts the relative position between the original plate and the substrate, wherein
the controller is configured to adjust the irradiation condition based on the process information.

3. The imprinting device according to claim 1, wherein the accuracy index corresponds to either a time duration required for a fluctuation of the relative position to converge or a magnitude of a force required to adjust the relative position.

4. The imprinting device according to claim 1, wherein the controller is configured to adjust the irradiation condition based on a weighted average of the plurality of accuracy indexes.

5. The imprinting device according to claim 1, wherein the adjusted irradiation condition includes at least one of: a portion of an irradiation amount of light reaching the transfer target material, an output intensity of a light source for irradiating the transfer target material with light, a time duration for the transfer target material being irradiated with light, a wavelength of the light emitted to the transfer target material, an illuminance of the light reaching the transfer target material, or a state of an irradiation amount adjusting mechanism disposed between the light source and the substrate.

6. An imprinting method, comprising:
adjusting a relative position between an original plate and a substrate when the original plate including a pattern is moved into contact with the substrate including a transfer target material;
irradiating the transfer target material with first light based on an irradiation condition before adjusting the relative position;
curing the transfer target material by irradiating the transfer target material with second light after adjusting the relative position; and
detaching the original plate from the transfer target material after curing the transfer target material, wherein
the irradiation condition is adjusted based on data including a plurality of accuracy indexes acquired based on respective relative positions for a plurality of the substrates.

7. A method for manufacturing a semiconductor device, comprising:
providing a processing target film formed over a semiconductor substrate;
adjusting a relative position between an original plate and the semiconductor substrate when the original plate is moved into contact with a transfer target material formed on the processing target film;
irradiating the transfer target material with first light based on an irradiation condition before adjusting the relative position;
curing the transfer target material by irradiating the transfer target material with second light after adjusting the relative position;
releasing the original plate from the transfer target material after curing the transfer target material; and
processing the processing target film using the transfer target material having the pattern being transferred as a mask, wherein
the irradiation condition is adjusted based on data including a plurality of accuracy indexes acquired based on respective relative positions for a plurality of the substrates.

8. The imprinting device according to claim 1, wherein irradiation of the first light is configured to increase a viscosity of the transfer target material.

9. The imprinting method according to claim 6, wherein irradiation of the first light is configured to increase a viscosity of the transfer target material.

10. The imprinting method according to claim 6, wherein the accuracy indexes each correspond to either a time duration required for a fluctuation of the respective relative position to converge or a magnitude of a force required to adjust the respective relative position.

11. The imprinting method according to claim 6, wherein the irradiation condition is further adjusted based on a weighted average of the plurality of accuracy indexes.

12. The imprinting method according to claim 6, wherein detaching the original plate from the transfer target material comprises transferring the pattern to the transfer target material.

13. The imprinting method according to claim 12, further comprising transferring the pattern on the transfer target material to the substrate.

14. The method according to claim 7, wherein irradiation of the first light is configured to increase a viscosity of the transfer target material.

15. The method according to claim 7, wherein the accuracy indexes each correspond to either a time duration required for a fluctuation of the respective relative position to converge or a magnitude of a force required to adjust the respective relative position.

16. The method according to claim 7, wherein the irradiation condition is further adjusted based on a weighted average of the plurality of accuracy indexes.

* * * * *